United States Patent [19]
Kim

[11] Patent Number: 6,137,743
[45] Date of Patent: Oct. 24, 2000

[54] SEMICONDUCTOR MEMORY DEVICE WITH REDUCED CONSUMPTION OF STANDBY CURRENT IN REFRESH MODE

[75] Inventor: Yong Ki Kim, Ichon-shi, Rep. of Korea

[73] Assignee: Hyundai Electronics Industries Co., Ltd., Kyoungki-do, Rep. of Korea

[21] Appl. No.: 09/472,982

[22] Filed: Dec. 28, 1999

[30] Foreign Application Priority Data

Dec. 28, 1998 [KR] Rep. of Korea ................... 98-59561

[51] Int. Cl.$^7$ ................................................. G11C 7/00
[52] U.S. Cl. ........................................... 365/222; 365/226
[58] Field of Search ............................ 365/222, 226, 365/230.03, 236

[56] References Cited

U.S. PATENT DOCUMENTS

| | | | |
|---|---|---|---|
| 4,716,551 | 12/1987 | Inagaki | 365/222 |
| 5,349,562 | 9/1994 | Tanizaki | 365/222 |
| 5,365,487 | 11/1994 | Patel et al. | 365/226 |
| 5,455,801 | 10/1995 | Blodgett et al. | 365/222 |
| 5,499,213 | 3/1996 | Niimi et al. | 365/222 |
| 5,555,527 | 9/1996 | Kotani et al. | 365/222 |
| 5,684,751 | 11/1997 | Manning | 365/222 |
| 5,740,118 | 4/1998 | Sato et al. | 365/222 |
| 5,774,404 | 6/1998 | Eto | 365/222 |
| 5,894,446 | 4/1999 | Itou | 365/222 |
| 5,901,101 | 5/1999 | Suzuki et al. | 365/222 |
| 6,026,043 | 2/2000 | Suzuki | 365/222 |

*Primary Examiner*—Trong Phan
*Attorney, Agent, or Firm*—Nath & Associates; Gary M. Nath; Harold L. Novick

[57] ABSTRACT

Disclosed is a semiconductor memory device with a reduced consumption of standby current in a self-refresh mode. The semiconductor memory device includes a DC voltage source control circuit unit for controlling a DC voltage generating unit. The DC voltage source control unit periodically turns on and off the DC voltage generating unit in such a fashion that voltages sources used for a self-refresh operation are maintained their OFF states during standby in a self-refresh mode.

1 Claim, 6 Drawing Sheets

SEMICONDUCTOR MEMORY DEVICE WITH REDUCED CONSUMPTION OF STANDBY CURRENT IN REFRESH MODE

BACKGROUND OF THE INVENTION

1. Field of the Invention

The present invention relates to a semiconductor memory device with a reduced consumption of standby current in a self-refresh mode, and more particularly to a semiconductor memory device configured to periodically turn on/off voltage sources used for a self-refresh operation during standby in a self-refresh mode, thereby reducing consumption of standby current.

2. Description of the Prior Art

Generally, DRAMs involve refresh operations which may be carried out in an auto-refresh mode or a self-refresh mode. In either refresh mode, a refresh operation is initiated in response to a refresh command. Although the refresh operation in the auto-refresh mode is externally controlled, the refresh operation in the self-refresh mode is internally controlled. That is, in the self-refresh mode, the refresh operation initiated in response to a refresh command proceeds in a self-controlled fashion in accordance with instructions of a timer internally included in an associated chip.

In particular, synchronous DRAMs are configured to enter a self-refresh mode in sync with a clock signal. That is, in the case of such a synchronous DRAM, entry into the self-refresh mode is determined, based on a RAS-bar signal, CAS-bar signal, a column selection signal, and a clock enable signal, etc. externally supplied at a positive edge of the clock signal. In association with a refresh operation in the self-refresh mode, such a synchronous DRAM should be equipped with a configuration allowing the DRAM to exit the self-refresh mode after conducting individual refresh operations in the self-refresh mode at intervals of time internally determined or in the process of any one of the individual refresh operations. In the self-refresh mode, internal operations of the chip are carried out in an asynchronous fashion without being controlled by any clock signal externally applied to the chip. Such a condition is established by an inactivation of a clock enable signal input pin. For this reason, exit from the self-refresh mode is also carried out in an asynchronous fashion. The exit from the self-refresh mode is achieved when the clock enable signal input pin is activated again. That is, a re-activation of the clock enable signal input pin allows the external clock signal to be sent again to the interior of the chip. As a result, the clock enable signal affects the operation of the chip to exit the self-refresh mode. After a certain period of standby time elapses following the exit from the self-refresh mode, a desired operation other than that of the self-refresh mode is conducted.

The operation in the self-refresh mode conducted under the above mentioned conditions involves a clock-synchronous entry operation, individual asynchronous internal refresh operations, and an asynchronous exit operation.

In order to realize a self-refresh operation as mentioned above, a DRAM, which may be a synchronous DRAM or a DRAM of a type other than the synchronous type, should be equipped with a variety of internal functional units.

FIG. 1 is a block diagram illustrating a DRAM having a conventional configuration for a self-refresh operation.

Referring to FIG. 1, a state machine unit 10 is illustrated which serves to set a logic for processing commands, addresses, and data externally applied through external pins to set a desired operation of the DRAM. For instance, when the state machine unit 10 receives a RAS active command, it decodes the received RAS active command using a command decoder, and generates a RAS active signal eractive based on the decoded RAS active command, thereby allowing a RAS active cycle to proceed.

A self-refresh state control unit 12 serves not only to sense entry into a self-refresh mode or exit from the self-refresh mode, but also to keep a self-refresh state. That is, when a self-refresh command signal selfcom indicative of receipt of a self-refresh command at the state machine unit 10 is generated, the self-refresh state control unit 12 generates a self-refresh signal selfref to keep a self-refresh state.

A ring oscillator unit 14 is also provided which serves to set a reference clock interval. In response to entry of the DRAM into a self-refresh state, the ring oscillator unit 14 operates to generate a reference clock signal toggled at a fixed frequency. The frequency of the reference clock signal is about 1 $\mu$s.

Along with the ring oscillator unit 14 providing the reference clock signal, a frequency divider unit 16 determines respective intervals of individual refresh operations, following the entry of the DRAM into the self-refresh state. That is, the frequency divider unit 16 generates clock signals respectively having a variety of doubly increasing frequencies to be used as frequencies for refresh operations. The frequency divider unit 16 includes a logic for doubly increasing the frequency for each refresh operation in response to the reference clock signal from the ring oscillator unit 14.

The clock signals of different frequencies from the frequency divider unit 16 are applied to a self-refresh request control unit 18 which serves to allow individual refresh operations to be selectively conducted. The self-refresh request control unit 18 selects a desired one of the clock signals of different frequencies generated from the frequency divider unit 16 and generates a self-refresh request signal srefreq in response to an optional edge of the selected clock signal. The self-refresh request signal srefreq is outputted from the self-refresh request control unit 18 as a reference signal for a refresh operation.

The self-refresh request signal srefreq is sent to the self-refresh state control unit 12. The self-refresh request signal srefreq is also applied to an internal row active control unit 20 and an internal row address counter unit 22. In response to the self-refresh request signal srefreq, the internal row active control unit 20 generates an output signal iractive adapted to determine an address, for which a desired refresh operation is to be conducted, while establishing a row path.

In response to the output signal iractive from the internal row active control unit 20, an internal row address counter unit 22 generates a row address and determines the order of individual refresh operations to be conducted. That is, the internal row address counter unit 22 operates in such a fashion that it stores a row address to be used in a first one of refresh operations to be conducted, increments the row address for the next refresh operation, and then stores the incremented row address.

The output signal iractive from the internal row active control unit 20 is also applied to a row address arbiter unit 24. In response to the signal iractive adapted to inform of initiation of a refresh operation, the row address arbiter unit 24 selects a desired one of the internal row addresses generated from the internal row address counter unit 22 and then sends the selected internal row address to the row path. The internal row address outputted from the row address arbiter unit 24 is finally supplied to row decoders arranged in the vicinity of the memory cell arrays of the DRAM via a row path control unit 26. Thus, a refresh operation is conducted for a selected one groups of rows in the memory cell array.

The row path control unit 26 is a logic for performing a RAS activation (namely, a row path activation) basically involved in the refresh operation initiated in response to the signal iractive. That is, the row path control unit 26 transfers a row address applied thereto to the row decoders, thereby causing an optional group of rows (word lines) to be selected. Thereafter, data is activated on bit lines. In response to this activation, bit line sense amplifiers operate to amplify the data. The amplified data is stored again in cells.

A self precharge control unit 28 is also provided which serves to precharge (namely, inactivate) a self-refresh operation. A DC voltage generating unit 32 generates a variety of voltages to be used for operation of each unit in the DRAM, and supplies the generated voltage to each unit. However, a connection relationship between the DC voltage generating unit 32 and each unit is abbreviated for the simplification of the drawing.

Referring to FIG. 1, a plurality of blocks 30 are also illustrated, each of which includes a memory cell array and a bit line sense amplifier array. Each block 30 also includes a core logic part of the DRAM where a memory cell array is arranged. Each bit line sense amplifier of the bit line sense amplifier array included in each block 30 serves to amplify data signal activated in the activated data on the bit line coupled thereto and then stores the amplified data in the cell coupled thereto.

The refresh operation performed in the DRAM is a complete operating cycle even though there is no data input and output conditions. This operating cycle is a RAS cycle typically called a "tRC". All voltage supply units effect the refresh operation. For such a refresh operation, the voltage supply units should keep their normal operations. These voltage supply units may include a VPP voltage supply unit, which is a high voltage source unit used to activate word lines, a VBB voltage supply unit, which serves to supply a bulk voltage for cell arrays, and a VBLP voltage supply unit, which serves to precharge bit lines after an establishment of the RAS cycle. Where an internal voltage is used for an internal voltage drop, a VINT voltage supply unit should also keep its normal operation.

The self-refresh operation of the DRAM equipped with the above mentioned conventional self-refresh configuration will now be described in conjunction with FIGS. 2a to 2c.

FIG. 2a is a timing diagram illustrating a typical self-refresh operation performed in the conventional configuration. FIG. 2b is a timing diagram illustrating operations of one DRAM cell and one bit line sense amplifier involved in the conventional self-refresh operation. FIG. 2c is a timing diagram illustrating a completion of the self-refresh operation performed in the conventional DRAM.

When an auto refresh command is inputted under the condition in which a clock enable signal (CKE) input pin transits to a low state thereof, an auto-refresh pulse aref is generated, as shown in FIG. 2a. In response to the auto-refresh pulse aref, the self-refresh signal selfref is activated from its low state to its high state. As a result, the ring oscillator unit 14 and frequency divider unit 16 start to perform their operations, respectively. A first refresh operation is activated by the auto-refresh pulse aref and precharged by a sense delay signal sensdly outputted from the self-precharge control unit 28. Refresh operations following the first refresh operation are activated by pulses of self-refresh request signals srefreq outputted from the self-refresh request control unit 18 while having different frequencies in response to an output signal from the frequency divider unit 16, respectively. Similarly to the first refresh operation, the following refresh operations are precharged by the sense delay signal sensdly from the self-precharge control unit 28. That is, both the DRAM cell and bit line sense amplifier conduct their refresh operations while keeping their activated states at an interval of time between the signals srefreq and sensdly, respectively.

Referring to FIGS. 2a to 2c, it can be found that refresh operations have an interval of 16 μs. That is, refresh operations are repeated at an interval of 16 μs.

For reference, the refresh interval internally controlled can be diversely set by the designer. Where every refresh operation is to be carried out at an interval of, for example, 100 μs, the period of time, in which a RAS cycle is conducted, is within 100 ns. The remaining time is a standby time.

Meanwhile, in conventional DRAMs, the voltage source units, which are used in a normal operation involving data input and output conditions, are the same as those used in refresh operations. This means that the voltage source units are maintained in their ON states, respectively, during the standby time corresponding to a large portion of the time interval of refresh operations. A large amount of standby current is consumed. For example, where the amount of current consumed by the voltage source units is about 500 μA, the amount of standby current consumed is about 200 μA. Since the voltage source units of conventional DRAMs as mentioned above operate even in a standby mode during a self refresh operation, there is a problem in that a large amount of electric power is unnecessarily consumed.

SUMMARY OF THE INVENTION

Therefore, an object of the invention is to provide a semiconductor memory device configured to keep all voltage source units thereof in their OFF states during a standby period in a self-refresh mode, thereby being capable of reducing the amount of standby current consumed by the voltage source units.

In accordance with the present invention, this object is accomplished by providing a semiconductor memory device comprising: a self-refresh state control unit for receiving a self-refresh command signal from a state machine, and generating a self-refresh signal, based on the received self-refresh command signal; a frequency divider unit for receiving the self-refresh signal from the self-refresh state control unit, and generating a plurality of clock signals having different frequencies in response to the received self-refresh signal; a self-refresh request control unit for receiving a selected one of the clock signals from the frequency divider unit, and generating a self-refresh request signal, to be used as a reference signal for a refresh operation, based on the received clock signal; a DC voltage source control circuit for receiving the self-refresh signal from the self-refresh state control unit along with a part of the clock signals outputted from the frequency divider unit; and a DC voltage generating unit controlled by an output signal from the DC voltage source control circuit in such a fashion that it is periodically turned on and off in an enable state of the self-refresh signal.

BRIEF DESCRIPTION OF THE DRAWINGS

Other objects and aspects of the invention will become apparent from the following description of embodiments with reference to the accompanying drawings in which:

FIG. 5b is a circuit diagram illustrating a switching circuit adapted to control a variety of voltage source units included in the DRAM, based on a refresh standby mode sensing signal generated from the DC voltage source control circuit unit of FIG. 5a.

DESCRIPTION OF THE PREFERRED EMBODIMENTS

Figure 1:
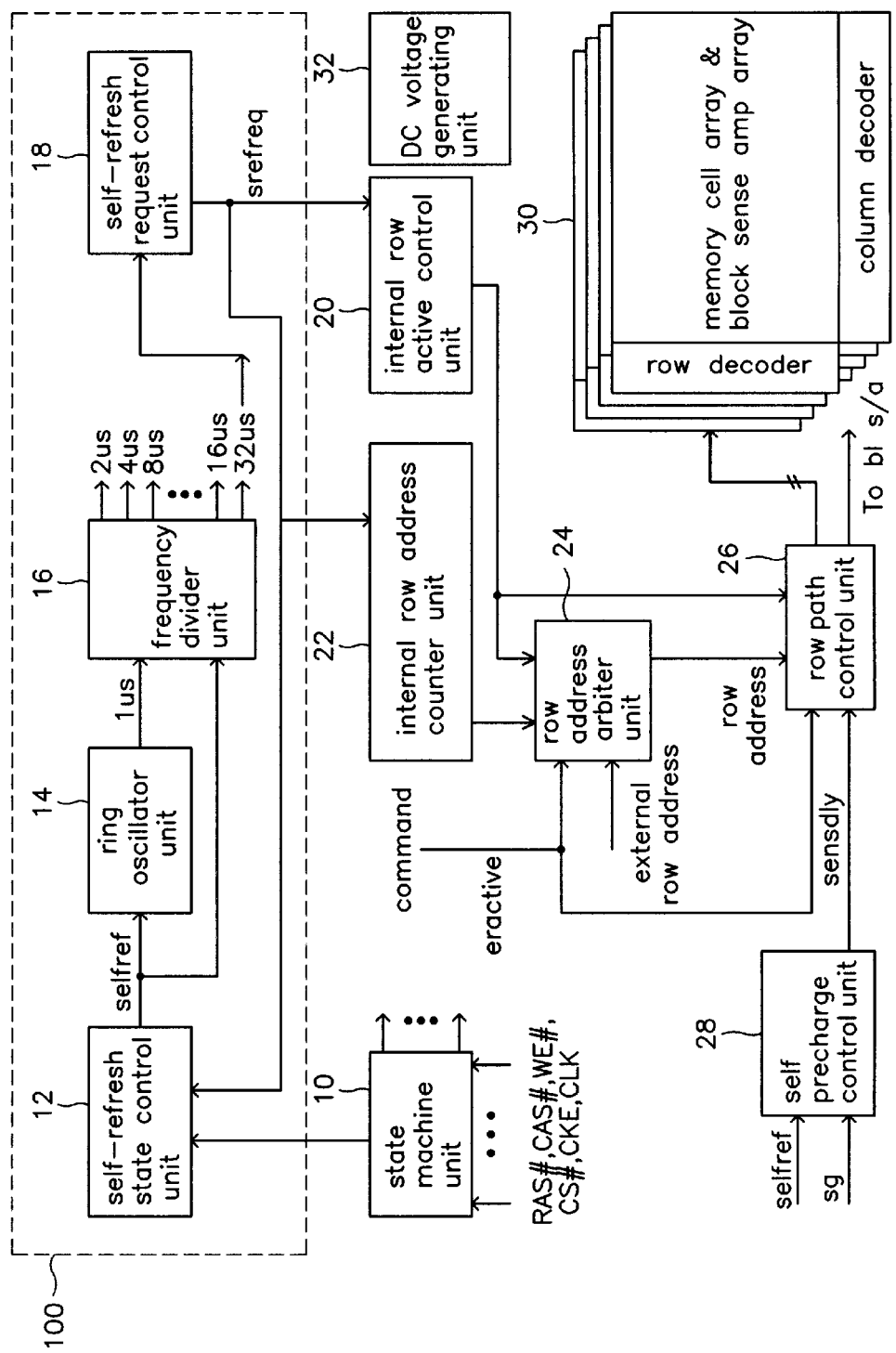
FIG. 1 is a block diagram illustrating a DRAM having a conventional configuration for a self-refresh operation.
Figure 2A:
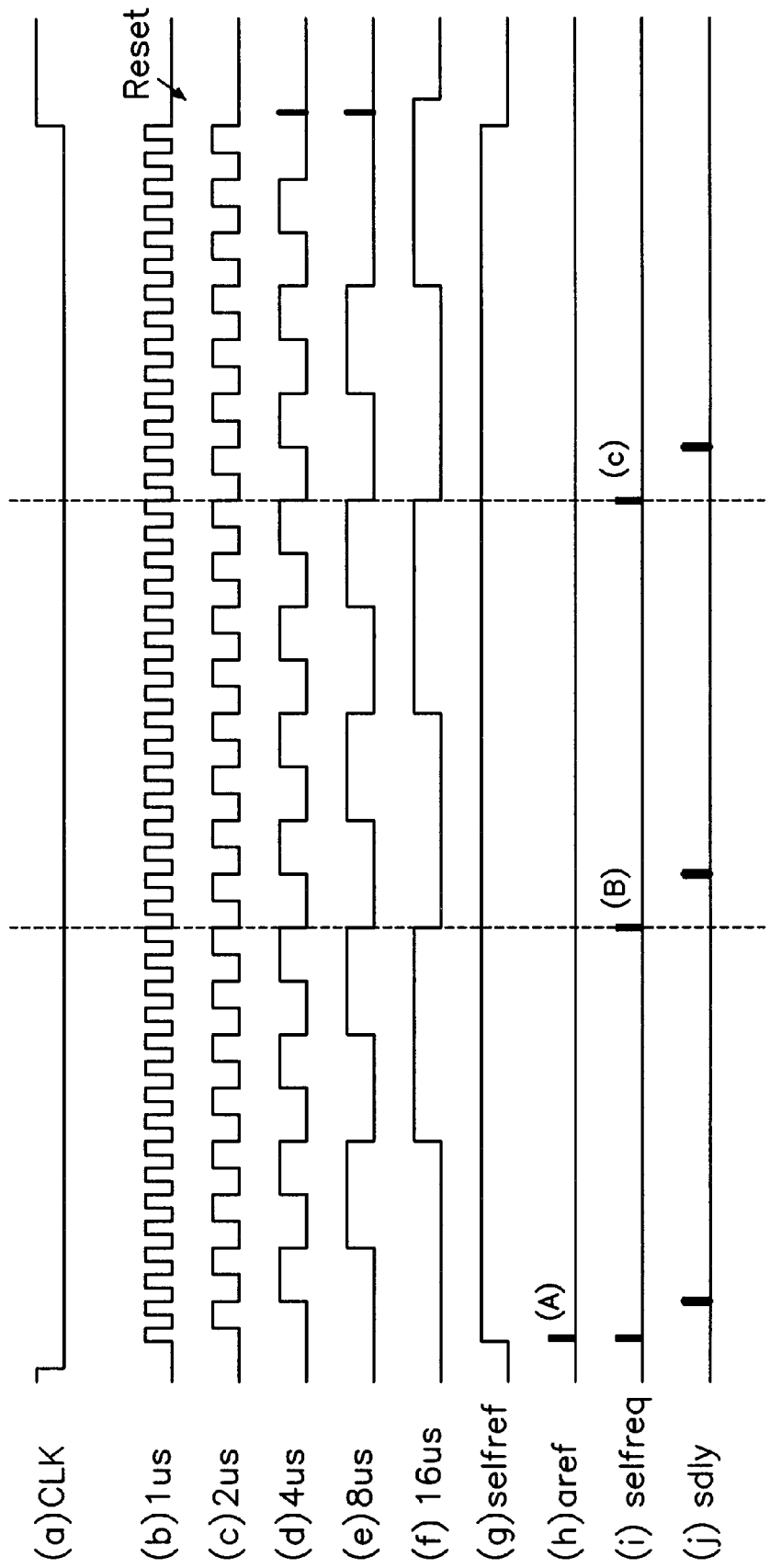
FIG. 2a is a timing diagram illustrating a typical self-refresh operation performed in a conventional self-refresh configuration.
Figure 2B:
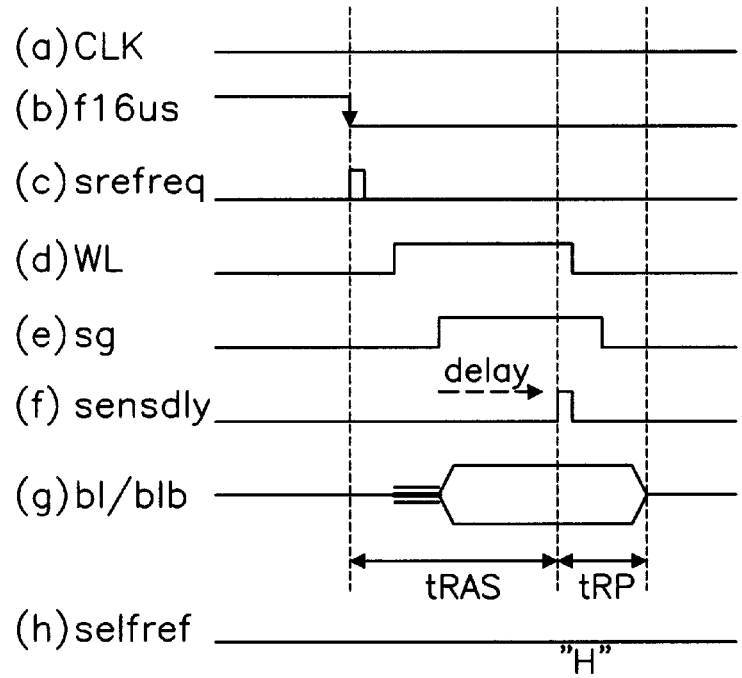
FIG. 2b is a timing diagram illustrating operations of one DRAM cell and one bit line sense amplifier involved in a self-refresh operation of a conventional DRAM.
Figure 2C:
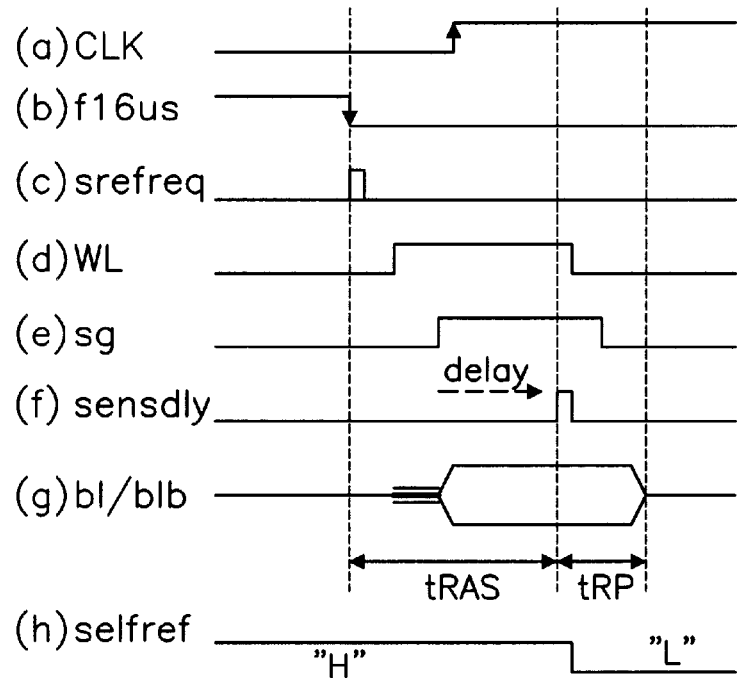
FIG. 2c is a timing diagram illustrating a completion of the self-refresh operation performed in the conventional DRAM.
Figure 3:
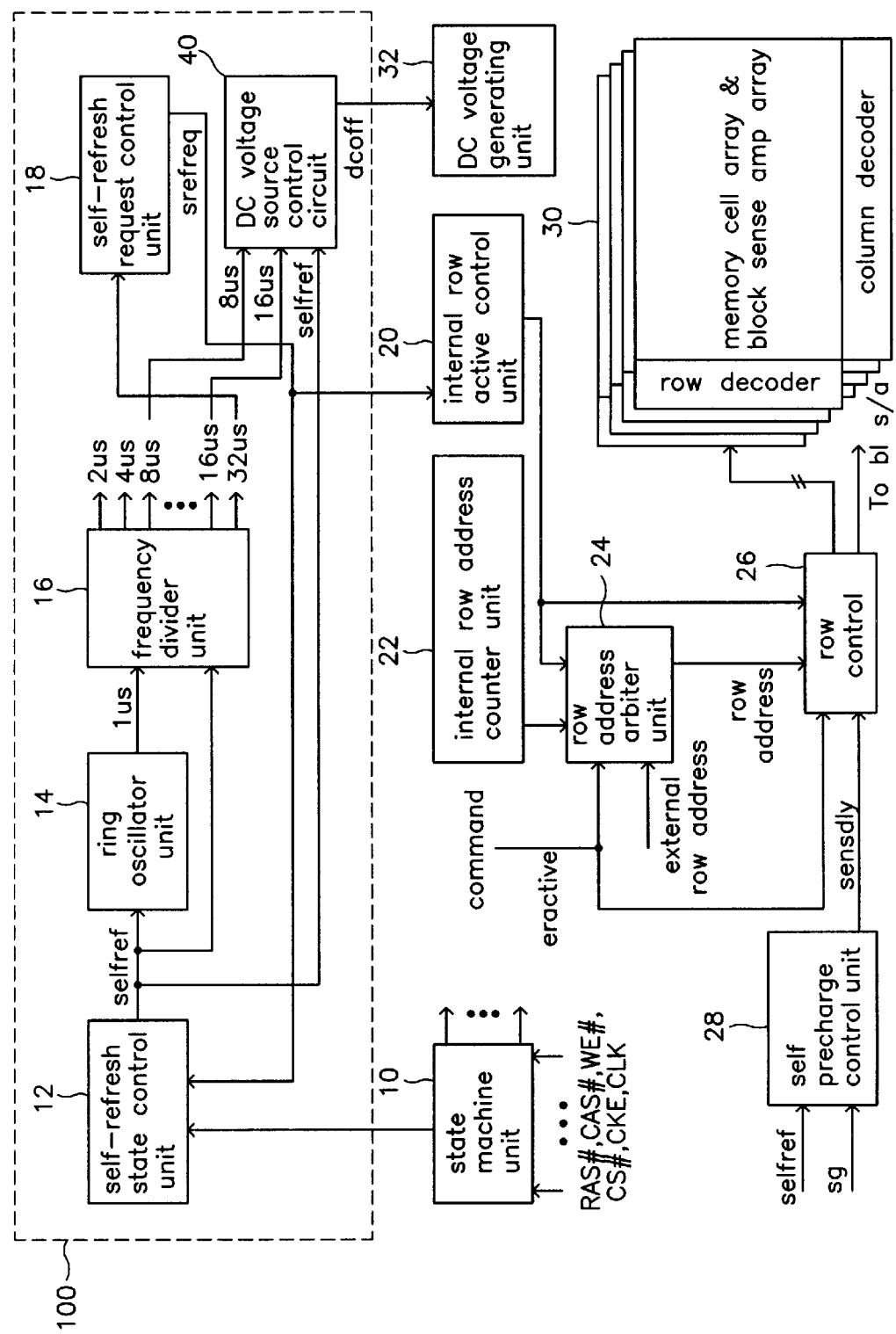
FIG. 3 is a block diagram illustrating a DRAM having a configuration for a self-refresh operation according to an embodiment of the present invention.

FIG. 3 is a block diagram illustrating a DRAM having a configuration for a self-refresh operation according to an embodiment of the present invention. In FIG. 3, elements respectively corresponding to those in FIG. 1 are denoted by the same reference numerals, respectively.

As shown in FIG. 3, the DRAM includes a state machine unit 10 for processing commands, addresses, and data externally applied through external pins to set a desired operation of the DRAM, a self-refresh state control unit 12 for sensing entry into a self-refresh mode or exit from the self-refresh mode and keeping a self-refresh state, a ring oscillator unit 14 for setting a reference clock interval, and a frequency divider unit 16 for determining respective intervals of individual refresh operations along with the ring oscillator 14, following the entry of the DRAM into the self-refresh state. The DRAM also includes a self-refresh request control unit 18 for receiving the clock signals of different frequencies from the frequency divider unit 16, and allowing individual refresh operations to be conducted, based on the received clock signals, respectively, an internal row active control unit 20 for generating a signal iractive, in response to a self-refresh request signal srefreq outputted from the self-refresh request control unit 18, to determine an address, for which a desired refresh operation is to be conducted, while establishing a row path, and an internal row address counter unit 22 for generating a row address in response to the signal iractive outputted from the internal row active control unit 20, thereby determining the order of individual refresh operations to be conducted. The DRAM further includes a row address arbiter unit 24 for selecting a desired one of the internal row addresses generated from the internal row address counter unit 22, in response to the signal iractive adapted to inform of initiation of a refresh operation, and then sending the selected internal row address to the row path, and a row path control unit 26 for performing a RAS activation (row path activation) basically involved in the refresh operation initiated in response to the signal iractive, a self precharge control unit 28 for precharging a self-refresh operation proceeding in a row activation fashion. A plurality of blocks 30 are also included in the DRAM. Each block 30 includes a memory cell array and a bit line sense amplifier array. The DRAM further includes a DC voltage generating unit 32 for generating a variety of voltages for operations of the DRAM, and a DC voltage source control circuit unit 40 for sensing an standby operation state, in which an operation other than a RAS cycle for conducting a direct refresh operation is conducted during the self-refresh mode, thereby controlling operations of essential DC voltage source units included in the DRAM in the standby operation state. In a self-refresh controller 100 of the DRAM, the DC voltage control circuit 40 receives the self-refresh signal selfref outputted from the self-refresh state control unit 12 and the clock signals 8 μs and 16 μs outputted from the frequency divider unit 16, and turns on and off the DC voltage source units 32. The DC voltage generating unit 32 generates a variety of voltages to be used for operation of each unit, and supplies the generated voltage to each unit. A connection relationship between the DC voltage generating unit 32 and each unit of the DRAM is abbreviated for the simplification of the drawing.

The DC voltage source control circuit unit 40 is added to a conventional self-refresh configuration for DRAMs in accordance with the present invention. This DC voltage source control circuit unit 40 is adapted to prevent consumption of electric power resulting from a continued supply of current to units where no operation is conducted in the standby operation state. To this end, the DC voltage source control circuit unit 40 senses a standby mode during a self-refresh operation, and turns off essential DC voltage source units of the DRAMs in the standby mode.

Figure 5A:
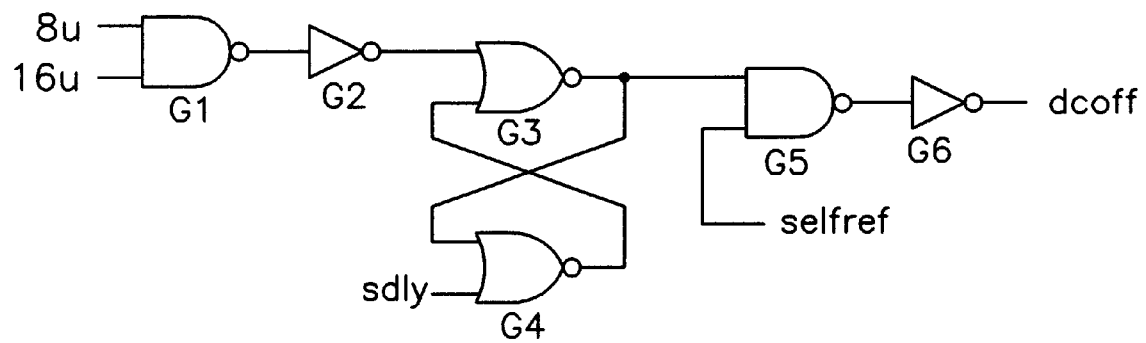
FIG. 5a is a circuit diagram illustrating a DC voltage source control circuit unit included in the DRAM of FIG. 3 and adapted to sense a self-refresh standby mode of the DRAM in accordance with the present invention.
Figure 5B:
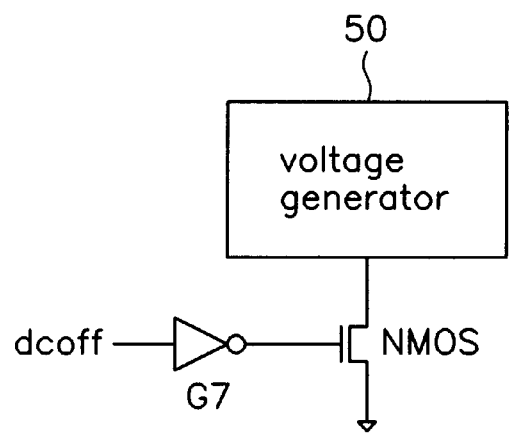

FIG. 5a is a circuit diagram of the DC voltage source control circuit unit 40 adapted to sense the self-refresh standby mode of the DRAM in accordance with the present invention. FIG. 5b is a circuit diagram illustrating a switching circuit adapted to control a variety of voltage source units included in the DRAM, based on a refresh standby mode sensing signal generated from the DC voltage source control circuit unit 40 of FIG. 5a.

As shown in FIG. 5a, two inputs, that is, clock signals respectively having clock intervals of 8 μs and 16 μs, are applied to the DC voltage source control circuit unit 40. The clock signals of 8 μs and 16 μs are those generated from the frequency divider unit 16, respectively. As described in FIG. 5a, the DC voltage source control circuit unit 40 use two clock signals respectively having one clock cycle and a half clock cycle as inputs thereof. Where both the clock signals are activated, namely, have a high level, the DC voltage source control circuit unit 40 outputs a refresh standby mode sensing signal dcoff which has a low level corresponding to an ON state of the DC voltage source. In response to the low-level refresh standby mode sensing signal dcoff, all voltage source units return to their normal modes, respectively.

Referring to FIG. 5a, a signal sdly is also applied to the DC voltage source control circuit unit 40. The signal sdly is a pulse signal outputted from a self-delay circuit included in the self-precharge control unit 28 to realize a precharge for the RAS cycle. In response to the signal sdly, the refresh standby mode sensing signal dcoff outputted from the DC voltage source control circuit unit 40 is activated, thereby causing all desired voltage source units to be switched to their OFF states, respectively.

As shown in FIG. 5b, the switching circuit includes a voltage generator 50 which operates in response to the signal dcoff from the DC voltage source control circuit unit 40. When the signal dcoff is activated, respective switch logics of desired voltage source units to be turned off are controlled to stop the operations of the voltage source units. As a result, consumption of current in the voltage generator 50 is suppressed. Thus, a low power consumption is achieved.

Figure 4:
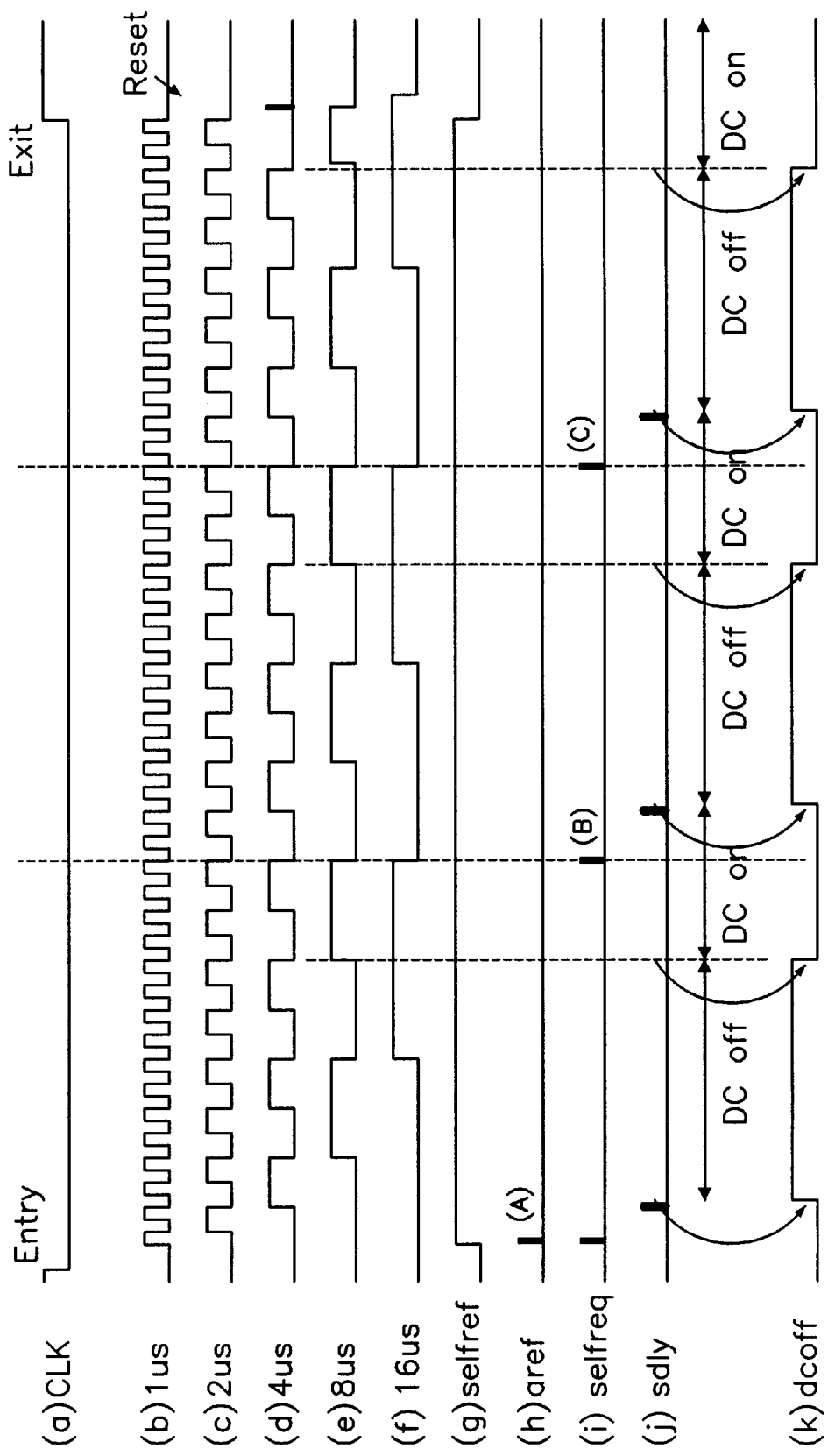
FIG. 4 is a timing diagram of a self-refresh operation according to the present invention.

This configuration will be described again in conjunction with FIG. 4 which is a timing diagram of a self-refresh operation according to the present invention.

When a RAS cycle is completed, a pulse signal sdly is generated. In response to the pulse signal sdly, the signal dcoff adapted to turn off all voltage source units transits to a high state thereof, so that it is activated. This activated signal dcoff affects switching signals to be applied to desired voltage source units, thereby causing the voltage source units to be turned off.

When clock signals of 8 μs and 16 μs transit simultaneously to their high levels, respectively, in a standby state established by the above mentioned switching operation, the signal dcoff transits to its low level. As a result, all voltage source units, which have been in their OFF states for the standby interval, respectively, turn on. Thus, all the voltage source units return to their normal modes, respectively.

After entering a self-prefresh mode, the DRAM performs a RAS cycle, namely, a refresh operation, in response to an auto-refresh pulse aref. During the RAS cycle, a data signal outputted from each memory cell is sensed and amplified by a bit line sense amplifier. The amplified data signal is then charged again in the memory cell. After a sufficient period of time for the recharge operation elapses, a precharge signal sdly is generated. In response to the precharge signal sdly, the RAS cycle is precharged. It is unnecessary for most voltage source units to be maintained in their ON state after the precharge operation is completed. That is, it is desirable to turn off the word line activation voltage source, cell array bulk voltage source, bit line charge voltage source, and cell plate voltage source in the standby state.

In the illustrated embodiment of the present invention, 16 μs is used as a refresh interval. That is, refresh operations are conducted at intervals of 16 μs, respectively. However, the refresh interval is variable depending on the characteristics of the memory device.

As apparent from the above description, the present invention provides a semiconductor memory device configured to turn on/off voltage sources used for a self-refresh operation during a standby period corresponding to a large portion of the refresh period, thereby reducing consumption of standby current.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device comprising:

a self-refresh state control unit for receiving a self-refresh command signal from a state machine, and generating a self-refresh signal, based on the received self-refresh command signal;

a ring oscillator unit for receiving the self-refresh signal from the self-refresh state control unit, and setting a reference clock interval;

a frequency divider unit for receiving the self-refresh signal from the self-refresh state control unit and the set reference clock interval from the ring oscillator unit, and generating a plurality of clock signals having different frequencies;

a self-refresh request control unit for receiving a selected one of the clock signals from the frequency divider unit, and generating a self-refresh request signal, to be used as a reference signal for a refresh operation, based on the received clock signal;

a DC voltage generating unit for generating a variety of voltages to be used for operation of each unit, in such a fashion that it is periodically turned on and off in an enable state of the self-refresh signal; and a DC voltage source control circuit for receiving the self-refresh signal from the self-refresh state control unit along with a part of the clock signals outputted from the frequency divider unit, and turning on and off the DC voltage generating unit, wherein the DC voltage source control circuit is adapted to sense a standby mode during a self-refresh operation, and turn off the DC voltage generating unit, thereby preventing the consumption of electric power resulting from a continued supply of current to units where no operation is conducted in the standby operation state.

* * * * *